United States Patent [19]
Matthews

[11] Patent Number: 5,403,439
[45] Date of Patent: Apr. 4, 1995

[54] METHOD OF PRODUCING SAME-SIZED PARTICLES

[75] Inventor: Mark Matthews, Richardson, Tex.

[73] Assignee: Texas Instruments Incorporated, Dallas, Tex.

[21] Appl. No.: 160,020

[22] Filed: Dec. 1, 1993

[51] Int. Cl.⁶ .................................................. B05D 1/00
[52] U.S. Cl. ...................................... 156/662; 156/625
[58] Field of Search ............... 156/662, 625, 629, 630, 156/633, 654

[56] References Cited

U.S. PATENT DOCUMENTS

| | | | |
|---|---|---|---|
| 4,581,103 | 4/1986 | Levine et al. | 156/662 X |
| 4,789,596 | 12/1988 | Allen et al. | 428/404 |
| 4,851,297 | 7/1989 | Allen et al. | 428/404 |
| 5,012,619 | 5/1991 | Knepprath et al. | 51/163.1 |

Primary Examiner—Thi Dang
Attorney, Agent, or Firm—John D. Kaufmann; James C. Kesterson; Richard L. Donaldson

[57] ABSTRACT

Particles (10) having a selected size are produced by placing oversized articles onto a support (12) having apertures (16) of the selected size. The supported particles (10) are subjected to an etchant (22) until they decrease in size sufficiently to pass through the apertures (16), following which the action of the etchant (22) is terminated and the particles are collected. If commingled particles (10) of the selected and/or larger sizes are placed on the support (12), those of the selected size immediately fall through the apertures.

16 Claims, 1 Drawing Sheet

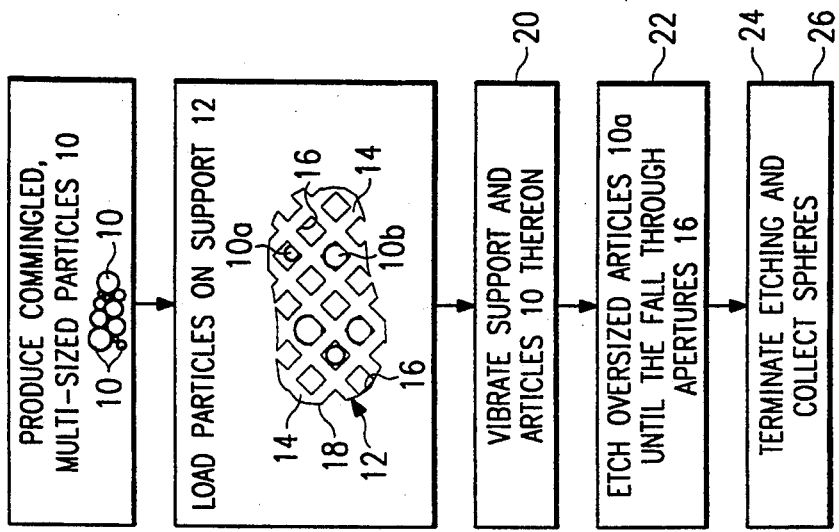
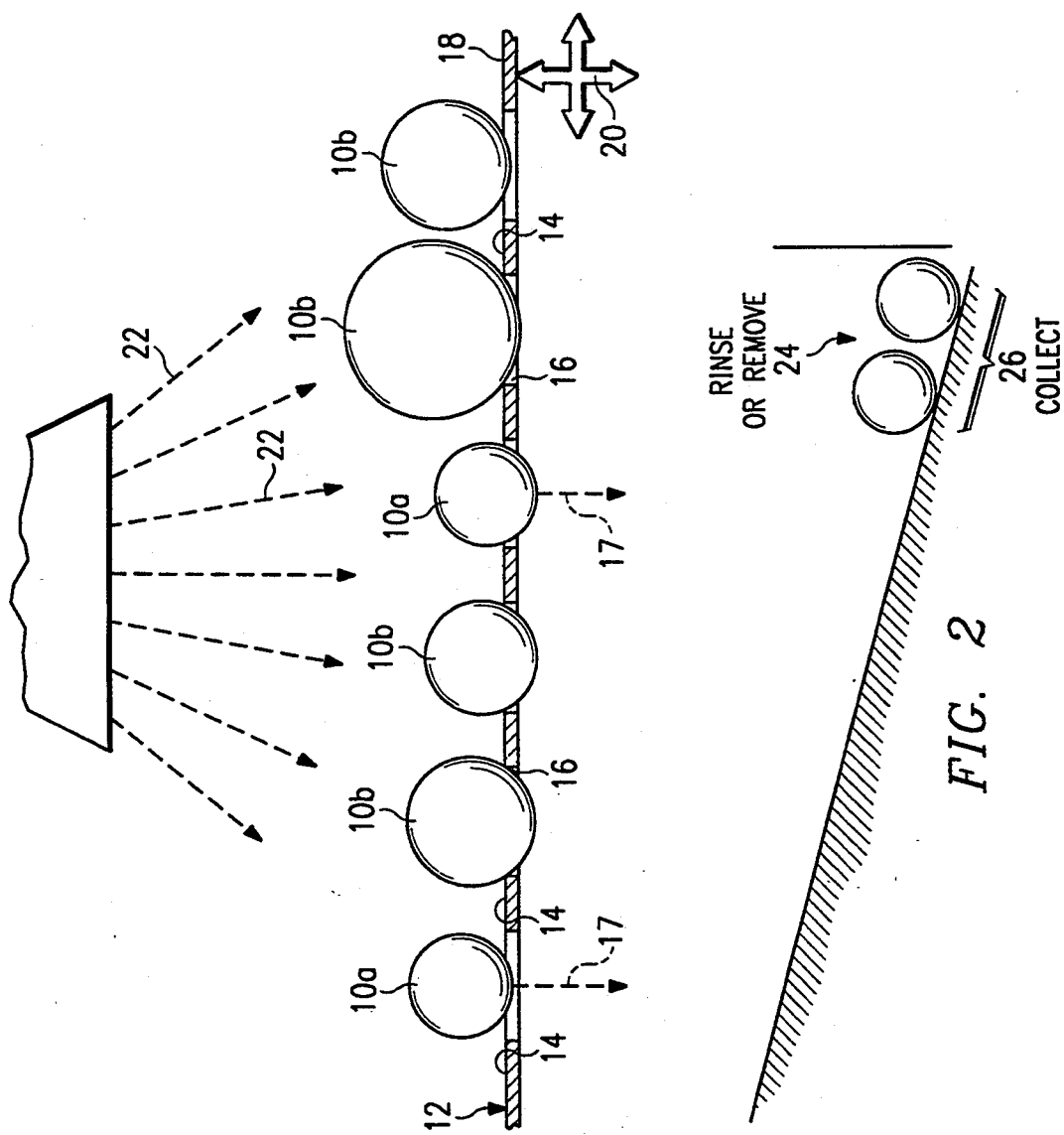

METHOD OF PRODUCING SAME-SIZED PARTICLES

BACKGROUND OF THE INVENTION

The present invention relates to a method of producing same-sized particles, and, more particularly, to a method of treating oversized particles, such as generally spherical or nearly spherical semiconductor particles, so that they possess the same size, or approximately the same size, and are therefore suitable for inclusion in relevant products. In specific embodiments, the particles are silicon spheres and the products are solar cells.

One type of solar cells includes a plurality of spherical semiconductor particles or members which protrude partially through both sides of, and are affixed to the walls of apertures formed in, a first flexible metal foil sheet. The details of the construction (i.e., the mechanical and electrical form, fit and function) and fabrication methodology of this type of solar cell may be found in the following commonly assigned U.S. Pat. Nos. 5,192,400; 5,091,319; 5,086,003; 5,028,546; 4,994,878; 4,992,138; 4,957,601; 4,917,752; 4,872,607; 4,806,495; and 4,691,076.

The construction details and the fabrication methodology of the type of solar cells with which the present invention is concerned are briefly summarized below.

This fabrication methodology utilizes generally uni-sized spheres of a semiconductor material, such as silicon, each of which has a p-n junction and is produced by one of a number of available techniques. See, for example the production methods disclosed in commonly assigned U.S. Pat. Nos. 4,637,855; 5,012,619; and 5,069,740. The silicon spheres typically constitute an outer portion or shell of one conductivity type surrounding an inner silicon portion of the other conductivity type, both portions having a selected purity and other relevant characteristics. The spheres are capable of producing electricity when radiation, such as sunlight, is incident thereon. The produced electricity may flow between conductors, one of which is electrically continuous with the outer portion of each sphere, and the other of which is electrically continuous with the inner portion of each sphere. In the aforenoted patents, these conductors are preferably flexible metal foils, to the first of which the spheres are affixed, as noted above.

Typical silicon sphere production techniques tend to produce batches of intermingled silicon spheres or spheroids having varying sizes and diameters. Thus, for reasons more fully set forth below, manufacturing the above type of solar cell requires either a method of rendering the spheres the same size or a non-damaging method of sorting the fragile silicon spheres. Such sorting methods are the subject of the following commonly assigned U.S. patent applications Ser. No. 08/159,645, filed Nov. 30, 1993; Ser. No. 08/159,673, filed Nov. 30, 1993; and Ser. No. 08/159,872, filed Nov. 30, 1993. Whether uni-sized spheres are achieved by an affirmative treatment step, as is the case with the present invention, or by sorting, the manner of acquiring same-sized spheres should be efficient and have high throughput so as not to constitute a bottleneck in a solar cell manufacturing operation.

Manufacturing the foregoing type of solar cells begins with forming in the first metal foil a pattern of apertures, the diameters of which are slightly less than the diameters of an available quantity of same-sized silicon spheres or spheroids. Several methods for forming the apertures are available. After formation of the aperture pattern, the spheres are loaded onto one side of the foil so that each aperture is occupied by a sphere. Because of the relative sizes of the diameters of the same-sized spheres and the apertures, the aperture-located spheres merely nest in their respective apertures on one side of the first foil without substantially protruding from both sides thereof.

The spheres are mechanically and electrically affixed and connected to the first foil. Such affixation and connection are achieved by applying suitable compressive forces to the foil-sphere system, as set forth in the above-noted patents. Typically the application of the compressive forces is achieved by the use of a press which acts on the spheres and the foil through selected compliant and rigid elements which are positioned between working surfaces of the press and the foil-sphere system. These elements prevent damage to the spheres and to the foil, while ensuring that the applied forces effectively move the spheres partially through and affix them to their respective apertures.

Partial movement of the spheres through their respective apertures effects mechanical affixation of the spheres to the walls of their apertures and renders electrically continuous with the first foil the outer surfaces of the spheres. These ends are achieved, in part, through the relationship of the larger diameters of the spheres to the smaller diameters of the apertures. This relationship directly results in the mechanical affixation and aids in effecting electrical continuity of the spheres with the first foil. When the spheres are moved partially through the apertures, the edges of the aperture walls and the surface of the spheres mechanically interact and mutually abrade each other to remove any natural oxide on the spheres or the aperture walls. Thus, a metal-sphere (i.e., an aluminum-silicon) bond is formed. The foregoing may be enhanced by the application of heat during the compression.

The outer portion of one conductivity type of the located and affixed spheres is removed, as by etching, from the spheres. This removal occurs only on one side of the first foil to expose the inner sphere portions of the opposite conductivity type. An electrically insulative layer is applied or deposited on the exposed inner sphere portions and the one side of the first foil. Small regions of the insulative layer which overlie the exposed inner sphere portions are removed, as by abrading or etching, to create openings or vias through which access to the inner sphere portions may be obtained. A second flexible metal foil is then mechanically and electrically connected to the inner portions of the spheres through the access openings by thermocompression bonding or a functionally equivalent technique.

The solar cell is now nearly complete and constitutes a flexible, photovoltaic matrix. Radiant energy directed toward the free surface of the first foil falls on the spheres to produce electricity. A utilization device is connected between the foils. The electricity flows from one portion, inner or outer, of the spheres through one of the foils, through the utilization device and ultimately through the other foil into the other portion, outer or inner, of the spheres. The insulative layer electrically insulates the foils from each other. The flexible cell may be conformed to a desired surface or shaped in selected fashion. A protective cover may be placed over or applied to the spheres. The cover may include or comprise lenses which direct an increased amount of incident radiant energy onto the spheres to increase the efficiency of the cell.

There are numerous reasons for the silicon spheres used in the foregoing type of solar cell to be approximately the same size. Such reasons are set forth in the foregoing patents and applications. In the past, uniform sphere diameters have been achieved by manual sorting followed by grinding or abrading oversized spheres until they have the same diameter as spheres determined to be acceptable as a result of manual sorting. At least the grinding phase of a sorting-grinding methodology requires an abundance of time which may deleteriously affect the throughput of the overall solar cell manufacturing process.

An object of the present invention is the provision of an efficient, high throughput, non-damaging method of producing same-sized semiconductor spheres suitable for use in fabricating solar cells.

SUMMARY OF THE INVENTION

With the above and other objects in view, the present invention contemplates an improved method of treating a particle having a size which is larger than a selected size so that the particle has the selected size.

The method includes supporting the oversized particle on a portion of a surface. The surface portion immediately surrounds and defines an aperture having the selected size. When the particle is supported on the surface portion, it is superjacent to the aperture. Next, the size of the supported particle is progressively decreased by exposing it to an etchant. The etchant may be sprayed onto the particle, with material removed by the etchant and the etchant also passing through the apertures. Etching continues until the particle is the size of the aperture and falls therethrough. After the particle falls through the aperture, the effects of the etchant are preferably terminated, as by rinsing the particle and/or separating it from the etchant.

The above method may be used to simultaneously treat a plurality of particles of assorted sizes, including sizes equal to and larger than the selected size. The particles are supported on the surface, which may be an etchant-resistant screen or grid, so that each is superjacent to an aperture. Each particle of the selected size more or less immediately falls through an aperture. Oversized particles fall through apertures after a sufficient amount of etchant-caused size decrease.

The surface may be vibrated. Vibration ensures that the particles are at least periodically superjacent to an aperture. It also ensures that the entire surfaces of oversized particles are exposed to the etchant and assists particles of the selected size to fall through an aperture.

The particles are preferably silicon spheres or spheroids. Preferred etchants include KOH, NaOH or a mixture of $NH_3$ and HF. The method may be utilized in the initial phases of a procedure for manufacturing solar cells, in which silicon spheres of the same size are ultimately affixed to a flexible metal foil.

BRIEF DESCRIPTION OF THE DRAWING

FIG. 1 is a flow diagram of the present invention; and
FIG. 2 is a generalized schematic or diagrammatic depiction of apparatus for carrying out the present invention as represented in FIG. 1.

DETAILED DESCRIPTION

Referring to FIGS. 1 and 2, the present invention is used to produce one or more particles 10 having a selected size. The method of the invention may be effected on the particles 10 one-at-a-time, but lends itself to simultaneously producing plural particles 10 of the selected size from a batch or group of commingled particles 10 of varying sizes.

In preferred embodiments, the particles 10 are silicon spheres or spheroids used in the manufacture of solar cells according to previously cited patents and applications. As will be clear hereinafter, the present method may be applied to other particles suitable for other end uses.

A particle 10 or plural particles 10 are first loaded onto a support 12. The support 12 includes one or more surface portions 14 which immediately surround and define one or more apertures 16. The size of the apertures 16 is the selected size so that particles 10a of the selected size will fall therethrough as indicated by the arrows 17. The foregoing may be achieved by the smallest dimension of the apertures 16 being equal to the diameter of the particles 10 when they are spheres or spheroids. The support 12 may constitute a screen, sieve or mesh-like member 18 which is resistant to the effects of various suitable etchants which are discussed below. The loading of the particles 10 onto the support 12 may be achieved in any convenient manner, including manual loading or feeding from a conveyor or hopper.

The particles 10 are supported on the support 12 so that each is superjacent or immediately above an aperture 16. This end may be achieved in a number of ways, including the imparting of vibratory motion or similar periodic motion to the support 12, as generally indicated by the reference numeral 20. The vibrating motion 20 may be just sufficient to cause oversize particles 10b to nest and then remain partly in and superjacent to an aperture 16. The vibratory motion 20 may also be sufficient to cause oversized particles 10b to move from aperture 16 to aperture 16 so as to momentarily nest and remain partly in and superjacent to an aperture 16 before moving to another aperture 16 with which the particles 10b have a similar momentary nesting relationship. If particles 10a loaded onto the support 12 include particles 10 of the selected size, the vibration 20 will facilitate their more or less immediately falling through the apertures 16, as shown at 17.

Oversized particles 10 are subjected to a suitable etchant 22 while they are on the support 12, which may be continuously or periodically vibrated. If the particles 10 are silicon spheres or spheroids, suitable etchants include KOH, NaOH and a mixture of $NH_3$ and HF. The etchant 22 may be heated or hot and is preferably applied to the supported particles 10b by spraying or similar techniques, although other modes of exposure are contemplated. As etching of the oversized particles 10b takes place, both material removed thereby from the particles 10b and the etchant 22 itself pass through the apertures 16. This passage is facilitated if the apertures 16 have a periphery different in shape from that of the particles 10, as is the case where the particles 10 are spheres or spheroids and the support 12 is a mesh or screen having square apertures 16. Steps may be taken to ensure that all portions of the particles 10 are subjected to the etchant spray 22. Such steps may include or constitute the vibratory motion 20 imparted to the support 12.

As etching of the particles 10b proceeds, their size decreases. When a particle 10 assumes the selected size, it falls through the aperture 16 at which it was superjacently supported. This falling through the aperture 16 may be enhanced in any convenient manner, such as by the continued application of the vibratory motion to the support 12.

Particles 10 of the selected size are collected below the support 12, as generally indicated at 24. The collected particles 10 include those which were of the selected size when first loaded onto the support 12 and immediately fell through an aperture 16, as well as particles 10 which assumed the selected size after etching.

After the particles 10a fall through the apertures 16, the effects of the etchant 22 are terminated as generally indicated at 24. This may be achieved by rinsing the particles 10a, or by removing the collected particles 10a to a benign location, as well as by removing or neutralizing the etchant 22 which has passed through the apertures 16. Terminating the effects of the etchant 22 on the particles 10a and collecting the same-sized particles 10a may occur more or less simultaneously.

What is claimed is:

1. A method of treating a particle having a size which is larger than a selected size so that the particle has the selected size, which comprises:
   supporting the particle on a portion of a surface which immediately surrounds an aperture having the selected size so that the particle is superjacent to the aperture, and then
   decreasing the size of the supported particle by exposing it to an etchant until it falls through the aperture.

2. A method as in claim 1, which further comprises: terminating the effect of the etchant on the particle after it has fallen through the aperture.

3. A method as in claim 2, wherein:
   the terminating step includes rinsing the particle.

4. A method as in claim 1, which further comprises directing the particle to a collection zone after it has fallen through the aperture.

5. A method as in claim 1 of simultaneously treating a plurality of particles having assorted sizes including sizes which are equal to and larger than the selected size, wherein:
   the particles are supported on respective portions of the surface which immediately surround respective apertures so that each particle is superjacent to a respective aperture, whereby each particle of the selected size substantially immediately falls through an aperture and particles larger than the selected size fall through an aperture after a sufficient decrease in the size thereof.

6. A method as in claim 5, which further comprises: vibrating the surface to effect the superjacency of each particle with respect to a respective aperture.

7. A method as in claim 6, wherein:
   the decreasing step is effected by spraying the etchant onto the supported particles, the etchant and material removed from the particles passing through the apertures.

8. A method as in claim 6, wherein:
   vibrating the surface effects on-going movement of the particles between different apertures to which the particles are momentarily superjacent.

9. A method as in claim 8, wherein:
   the on-going movement of the particles effects the exposure of the entire surfaces thereof to the etchant, and
   vibrating the surface also assists particles which have achieved the selected size to fall through their respective apertures.

10. A method as in claim 9, which further comprises: terminating the effect of the etchant on particles which have fallen through an aperture.

11. A method as in claim 10, wherein:
    the terminating step includes rinsing the particles.

12. A method as in claim 11, wherein:
    the particles are silicon spheres.

13. A method as in claim 12, wherein:
    the etchant is KOH, NaOH or a mixture of $NH_3$ and HF.

14. A method of treating a generally spherical semiconductor particle having a size which is larger than a selected size so that the particle has the selected size and is accordingly suitable for use in a product which comprises:
    supporting the particle on a portion of a surface which immediately surrounds an aperture having the selected size so that the particle is superjacent to the aperture, and then
    decreasing the size of the supported particle by exposing it to an etchant until it falls through the aperture.

15. In a method of producing a solar cell, the solar cell being of the type which includes a plurality of silicon spheres which have the same selected size and are affixed to a flexible metal foil, a method of treating generally spherical silicon spheres having various sizes so that the spheres have the selected size, which method comprises:
    supporting each sphere on a portion of a surface which immediately surrounds an aperture having the selected size so that each sphere is superjacent to a respective aperture, c a u s i n g spheres of the selected size to fall through the apertures, and
    decreasing the size of supported spheres which are larger than the selected sized by exposing the spheres to an etchant until they fall through their respective apertures, 16. A method as in claim 15, wherein:
    the semiconductor is silicon,
    the product is a solar cell, and
    the etchant is KOH, NaOH or a mixture of $NH_3$ and HF.

* * * * *